United States Patent [19]

Shrader

[11] 4,042,128
[45] Aug. 16, 1977

[54] SUBSTRATE TRANSFER APPARATUS FOR A VACUUM COATING SYSTEM

[75] Inventor: Robert L. Shrader, Castro Valley, Calif.

[73] Assignee: Airco, Inc., Montvale, N.J.

[21] Appl. No.: 635,475

[22] Filed: Nov. 26, 1975

[51] Int. Cl.$^2$ ............................................. C23C 13/08
[52] U.S. Cl. .................. 214/17 B; 104/135; 104/168; 118/49
[58] Field of Search ............ 214/17 B, 18 R; 198/110, 127; 104/135, 165, 168; 118/49, 49.1

[56] References Cited

U.S. PATENT DOCUMENTS

| 847,304 | 3/1907 | Allen | 104/135 X |
|---|---|---|---|
| 3,254,778 | 6/1966 | Marland et al. | 198/127 R X |
| 3,340,176 | 9/1967 | Belluso | 214/17 B X |
| 3,530,800 | 9/1970 | Watkins | 104/168 |
| 3,662,708 | 5/1972 | Shrader | 118/49 |
| 3,802,354 | 4/1974 | Bateson et al. | 104/135 X |

Primary Examiner—Robert G. Sheridan
Attorney, Agent, or Firm—David A. Draegert; Edmund W. Bopp

[57] ABSTRACT

Substrate transfer apparatus for a vacuum coating or processing system of the multiple compartment type, comprising a rectangular platform for carrying substrates to be coated, the platform being moveable through the compartments over and between supporting and guide rollers respectively, and having a gear rack on one side extending in the direction of motion, and driving means for the platform including an electric variable speed d.c. motor connected respectively, through individual one-way running clutches to a plurality of pinion gears, each pinion gear being independently biased for separately meshing with the rack, and limit switches positioned within the compartments and operable by the platform for controlling the electric motor.

11 Claims, 9 Drawing Figures

SUBSTRATE TRANSFER APPARATUS FOR A VACUUM COATING SYSTEM

BACKGROUND OF THE INVENTION

This invention relates to a vacuum coating system of the in-line load-lock type wherein substrates, such as silicon wafers for example, are transported for positioning within a vacuum chamber in proximity to a vapor source, such as sputtering electrodes or electron-beam evaporators, for coating as required.

The substrates which are first positioned on a carrier support at a loading port outside the vacuum chamber, are transported by the carrier through controlled gated load-locks and buffer zones into the process or coating chamber so as to be properly positioned with respect to, or slowly passed by the coating source. A vacuum coating system of this general type is disclosed in U.S. Pat. No. 3,662,708 granted May 16, 1972 to Robert L. Shrader and assigned to the same assignee as the present invention.

In this type of vacuum coating system, it is commercially advantageous to transport and position the workpieces or substrates without undue loss of production time; that is, it is desirable that the substrate transfer time be as small as possible in relation to the required coating time and that the equipment therefor be simple, positive and reliable. In many prior systems where the carrier is manually transferred from one position to another, or where one or more sets of drive rollers moving at constant speeds are used, or where complicated mechanical positioning means such as pneumatic thrust pistons, cables, linkages, etc. are used, the production process in general has not been satisfactory. This is especially the case where significant maintenance and down-time are encountered in complicated equipment, and where transfer of the substrates between process steps is time-consuming.

The present invention, therefore, is concerned with improved and simplified workpiece transfer equipment for a vacuum processing system of the character described, that readily lends itself to efficient transfer of the workpieces between load-locks, buffer zones, process chamber, etc. throughout the entire vacuum processing system.

SUMMARY OF THE INVENTION

According to the invention, the workpieces of substrates are carried through the various gate locks, buffer zones and process chambers on a carrier or platform that is supported and laterally guided by some means such as spaced rollers. The rollers may have fixed mountings within the compartments and engage lower and lateral edges at opposite sides of the carrier frame respectively; the frame itself need have no moving parts. The substrates are positioned individually on a tray-like holder that is supported in turn on the carrier frame. Translation of the carrier, which can be positioned in either a horizontal or vertical plane, is achieved through a means, such as a rack, that is a part of the carrier frame and aligned for sequential engagement with rotary driving means, such as pinion gears, spaced along the motion of the carrier through the compartments. Each pinion may be arranged to be separately and yieldingly biased into mesh with the rack for ensuring uniform engagement therewith; also, each pinion may be connected through a one-way running clutch with electric driving means to provide flexibility for smoothly accelerating as desired, the carrier from one driving pinion into the next forward pinion that, in turn, may be stopped or rotating at a uniform speed.

The rotary driving means are operated by a motive means which may comprise one or more suitable positioning motors, such as variable speed electric d. c. motors, automatically controlled by sensing or limit switches actuated according to selected positioning of the substrate carrier frame.

A principal object of the invention, therefore, is an improved substrate transport and transfer arrangement for a vacuum coating system of the in-line multiple chamber type having a platform-type carrier and multiple driving means therefor that are reliable and flexible in operation, capable of selective carrier acceleration as required, and comparatively simple and rugged in construction.

Another object is an improved and simplified substrate carrier that is adapted for linear movement in either a horizontal or vertical mode through the in-line chambers, and has laterally positioned drive means including spaced self-adjusting drive pinions that engage in succession with corresponding gear means on the carrier.

A related object is an improved substrate transfer arrangement as described above, wherein the substrate carrier platform is linearly guided by laterally positioned rollers and is moveable over supporting rollers through the in-line compartments, and wherein a clutch means for each drive pinion provides for acceleration of the platform into forward drive pinions.

Other objects, features and advantages will appear from the following description with reference to the accompanying drawings.

PREFERRED EMBODIMENT OF INVENTION

Figure 1:
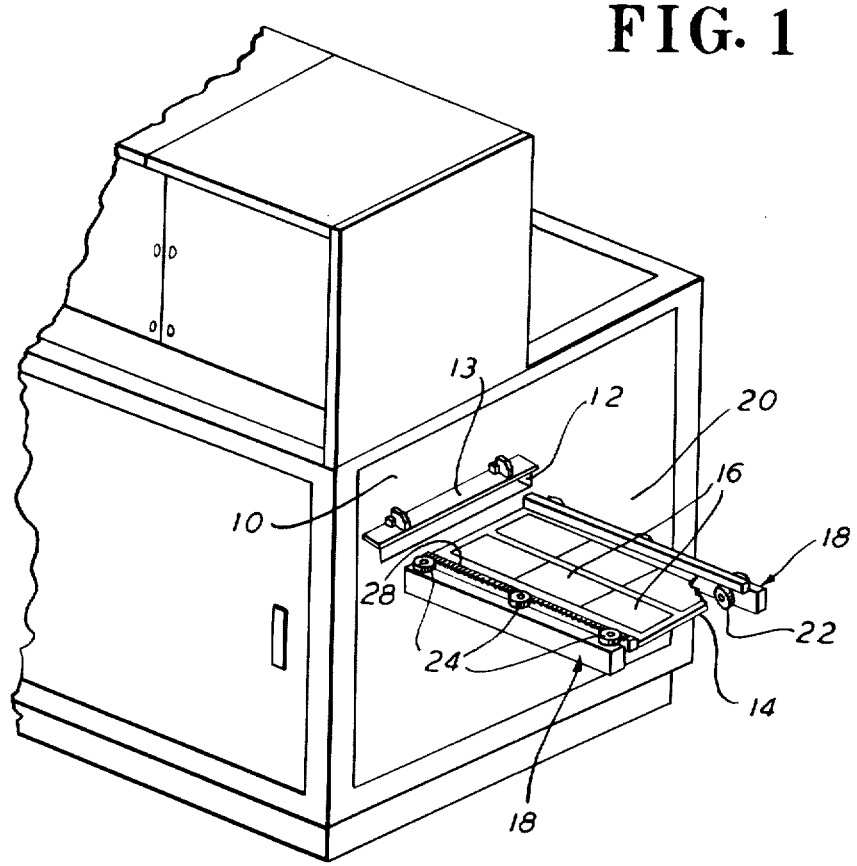
FIG. 1 is a partial perspective view of the loading end of in-line vacuum coating apparatus embodying the present invention, wherein translation of the substrate carrier is in the horizontal mode.

Referring briefly to FIG. 1, the loading or feed end of an in-line, multiple chamber vacuum coating installation embodying the invention is generally shown. In this type equipment, a load-lock compartment indicated at 10 has an entrance slot 12 with gate-type slit valve 13 for receiving a moveable platform or carrier 14 on which a number of substrates 16 to be vacuum coated are positioned. The substrates, such as silicon wafers for example, may be arranged on the platform in any preferred manner.

For convenience in positioning the carrier for horizontal translation and aligning it with the compartment entrance slot 12 for loading, spaced extension side supports 18, for example, are mounted on the front wall 20 of the compartment. Each support 18 has at the side adjacent to the carrier, a plurality of support rollers 22 (with horizontal axes as shown) over which the carrier 14 is moved, and a plurality of lateral guide rollers 24 (with vertical axes) engaging the opposite edges of the carrier for ensuring linear movement thereof into the loading compartment.

The interior of the compartment as well as following in-line compartments, are likewise provided with support and guide rollers of the character described above for maintaining "square" linear movement of the carrier throughout the compartments. The carrier can be moved at different rates and accelerated as desired through conventional loading and buffer zones, isolating gate locks or the like, into the process or coating chamber.

Figure 2:
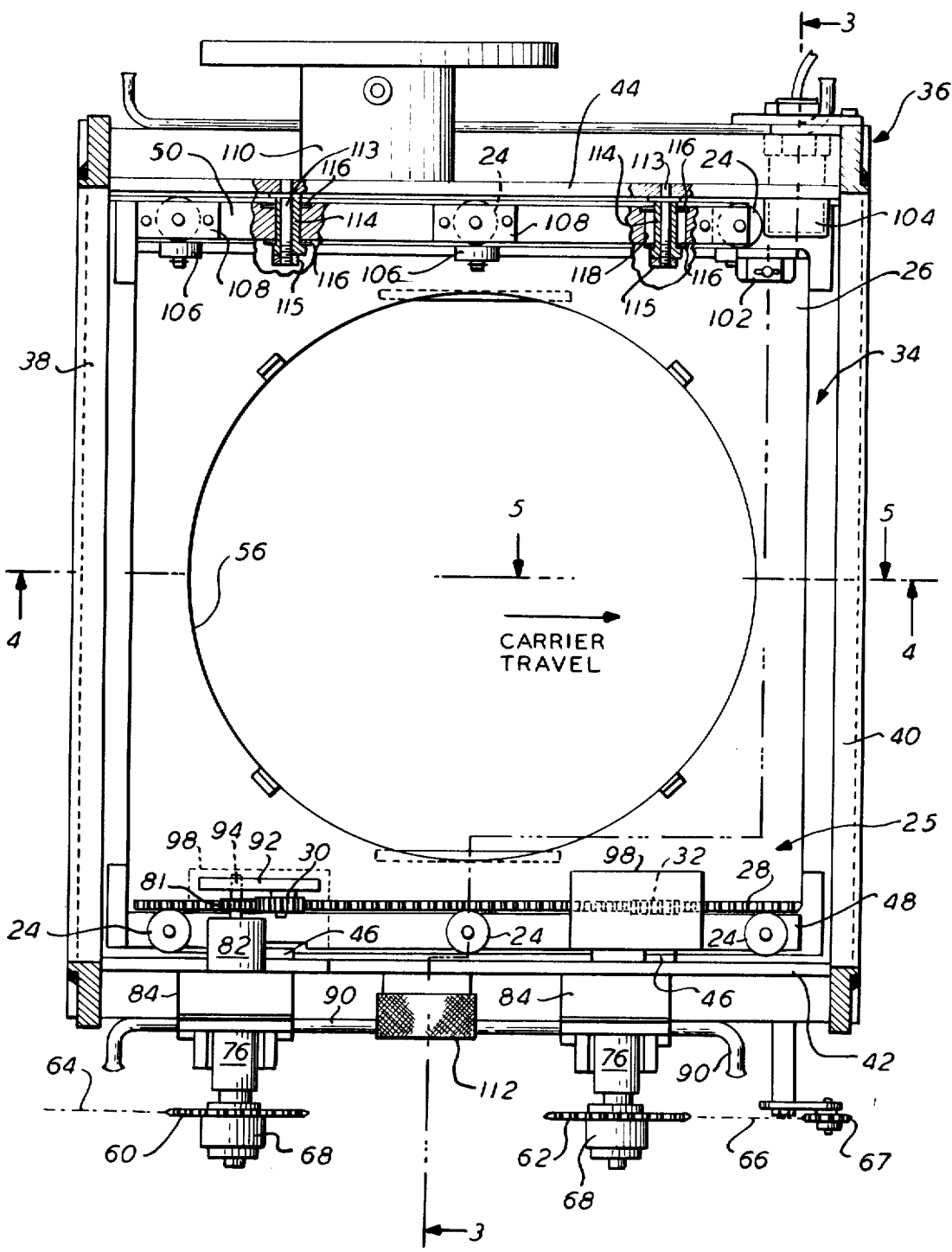
FIG. 2 is a plan view, partly broken away, of a substrate carrier platform and drive means therefore embodying the invention.
Figure 3:
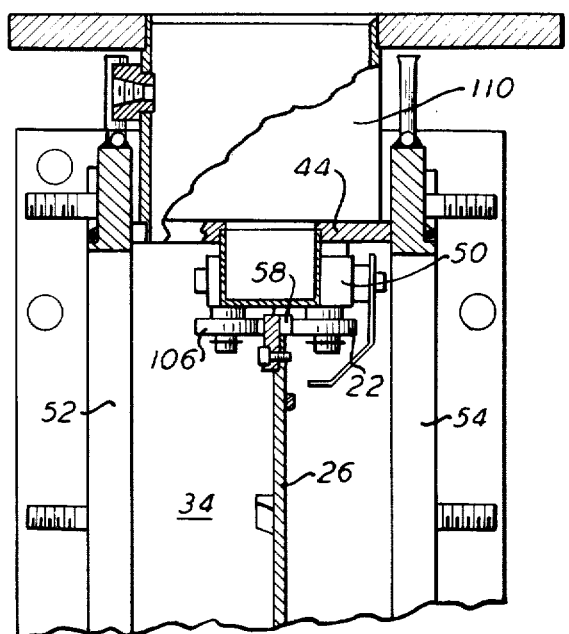
FIG. 3 is an end view partly in section, of the substrate carrier platform and mounting, taken along the line 3—3 of FIG. 2.

Referring specifically to FIGS. 2 and 3, a carrier 25 as herein shown, basically comprises a rectangular platform frame 26 having at one side a longitudinally extending gear rack 28 that is arranged to be engaged at any given time by at least one of two spaced driving pinion gears, such as 30 and 32, during the time that the carrier is within a given chamber.

For an adequate understanding of the invention including functioning of the substrate carrier and the driving means therefor, it will be sufficient to show a single vacuum chamber or compartment, such as the processing chamber 34 with the substrate carrier 25 positioned therein. The chamber housing 36 comprises slotted end walls 38 and 40 respectively, through which the substrate carrier can be linearly moved during transfer between chambers. The usual slot-sealing gate valves indicated in FIG. 1 at 13, are not shown in FIG. 2, etc. for simplicity; such gate or slit valves for the processing chamber are used when the chamber is directly connected with load and unload locks. Where buffer chambers between the locks and processing chamber are used, the chamber slots connecting with the buffer zones are not valved.

Figure 4:
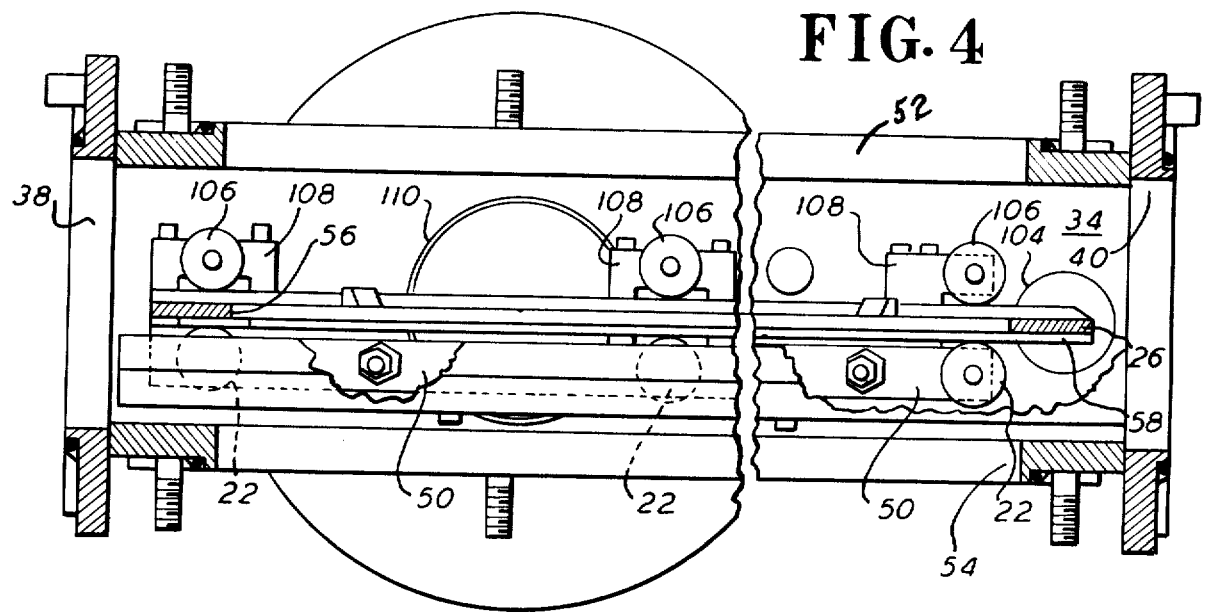
FIG. 4 is an elevational view, partly in section and broken away, taken along the line 4—4 of FIG. 2.

The chamber side walls 42 and 44 have buttress-like weldments 46 for supporting two bars or rails 48 and 50 that extend in parallel relation along the opposite side walls respectively, of the chamber as shown in FIGS. 2 and 3. These bars constitute guide mounts, as later described in detail for the carrier support rollers 22 and the carrier guide rollers 24, referred to above. The upper and lower sides 52 and 54 of the chamber housing are mainly open as indicated in FIG. 4 for communication respectively, with modular or other compartments that house desired processing equipment, such as the vapor coating source, substrate tray manipulator, etc.

The substrate carrier itself comprising the rectangular frame or platform 26 can serve either as a support tray itself, or to support a tray (not shown) on which a plurality of substrates are positioned for coating. The tray and array of substrates thereon may vary according to the preferred method of handling the substrates. For electron-beam evaporation coating, the substrate tray would be of the well-known circular domed type for seating within the circular opening 56 of the platform, as indicated in FIGS. 2 and 3. The carrier has no moving parts and its driven element, namely the gear rack 28, comprises a longitudinal strip that is integrally united to one side of the frame as best shown by FIG. 3. The rack is driven by gear pinions such as 30 and 32 that are mounted in fixed spaced relation on the chamber inner side wall 42 so as to mesh with the rack, and move the carrier frame linearly in the direction indicated in FIG. 2. The frame, supported at its opposite sides, rides freely over the support rollers 22 which are mounted on stub shafts 21 fixed in the corresponding side bar 48 or 50, as the case may be. The support rollers at the rack side of the frame engage the under side of the rack strip 28 itself, FIG. 3, and the support rollers at the other side of the frame engage a corresponding strip 58 defining the edge of the frame. Skewing of the frame by reason of the off-center rack drive is prevented by the lateral guide rollers 24 at both sides of the frame. These rollers are also mounted on stub shafts 23 fixed in the respective side bars 48 and 50. The axes of the guide rollers 24 are perpendicular to the support roller axes, so as to guide the outer edges of the rack and frame, FIG. 3, and thereby ensure linear motion of the carrier. Both the support and guide rollers have ball-bearing axle mounts as shown, for minimizing galling friction and for ensuring and even movement of the carrier frame throughout the in-line compartments.

The prime driving means for the carrier 25 is mounted on the exterior of the process chamber side wall 42, and comprises (for the chamber 34) two externally positioned sprocket wheels 60 and 62 that are connected respectively to a drive transmission that extends in sealed relation through the side wall into the chamber. This minimizes galling metal-to-metal sliding contact within a vacuum where the application calls for long operating periods at high temperatures. The sprocket wheels are chain-driven as indicated at 64 and 66 respectively, by separate d. c. variable speed motors (not shown) with suitable chain tensioning idler gear 67, or the like. The motor function is to start and stop the carrier and to time the carrier speed and positioning as required by lock sequencing and the coating process.

Figure 2A:
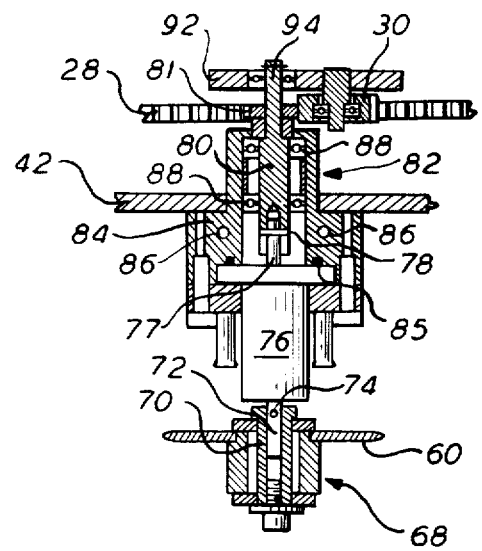
FIG. 2A is an enlarged detail view of carrier driving apparatus shown in FIG. 2.

As shown in FIG. 2A, each sprocket wheel is connected through a one-way clutch 68 having an overrunning sleeve 70, to a drive shaft section 72. The clutch sleeve is connected through a coupling or so-called "roll pin" 74 to the shaft section that constitutes the input shaft of a suitable rotary shaft vacuum seal 76, such as a "Ferro-Fluidic" seal. The output shaft 77 of the rotary seal is in turn connected by a roll pin 78 to another section of the drive shaft 80 that extends in turn through a bearing housing 82 in the chamber side wall 42. The bearing housing 82 which is welded in the side wall, has an enlarged diameter section 84 that extends exteriorly of the wall to constitute the mounting for the rotary seal 76 and sprocket wheel. An O-ring 85 makes a vacuum seal between the bearing housing 84 and shaft seal 76.

As certain moving parts within the bearing housing including the drive shaft bearings 88, must operate within a vacuum at high temperature, the bearing is provided with cooling passages 86 that are connected to a water cooling line 90, FIG. 3, so that excess heat can be transferred from the housing. For retarding heat flow from the drive gear shaft 80 to the rotary seal 76, the roll pin and slot connection at 78 between the shaft sections functions as a thermal resistance; i. e. the butt end of the seal output shaft 77 carrying the roll pin is spaced from the bottom of the coupling bore in drive shaft 80, as shown in FIG. 2A, thereby restricting the cross-section of the heat conducting path.

Figure 5:
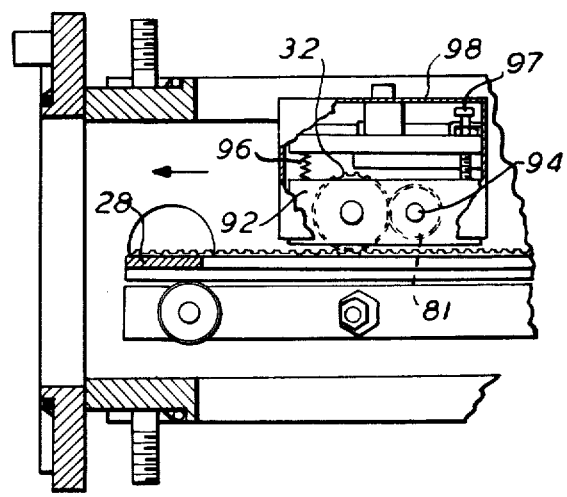
FIG. 5 is a detail view, partly in section and broken away, taken along the line 5—5 of FIG. 2 illustrating engagement of the drive pinion and carrier rack.

In practicing the invention, certain flexibility is required between the exterior driving means and the rack driving means in order to ensure proper gear meshing for an incoming carrier, and for accelerating as required the carrier from a preceding stage or chamber into the processing chamber where the carrier movement is to be comparatively uniform. To this end, a drive gear 81 is mounted on the prime drive shaft 80 for meshing with the pinion gear 30 referred to above. The pinion gear in turn, is mounted for floating movement on a bar 92 that is pivoted on the extended end 94 of the drive shaft 80 and biased at one end by a spring 96, FIGS. 3 and 5, so as to urge the pinion into mesh with the coarse pitch gear rack without jamming. Accordingly, as shown in FIG. 5, the center of the pinion 32, for example, is always on an arc concentric with the drive gear 81 so that continuous mesh between these gears is maintained irrespective of any required vertical adjustment of the pinion during meshing with the rack. For providing desired pinion-rack clearance, a tolerance adjusting screw 97 engages the opposite end of the pivoted bar 92; also, in order to give the drive gear 81 adequate rack clearance for horizontal positioning of the pivoted bar 92, its diameter is smaller than that of the pinion, FIGS. 2A and 5. Positive and controlled pinion meshing with the carrier rack is thereby provided when the rack is moved into meshing position, irrespective of possible chamber expansion, drive backlash, etc.

In the embodiment shown, referring to FIG. 3, the pinion gear 30 and sprocket wheel 60 are driven by a first motor (not shown) through the chain drive 64 in synchronism with another sprocket wheel and gear (not shown) of a preceding chamber from which the carrier was transferred; also, the pinion gear 32 connected to the sprocket wheel 62 is driven by a second motor (not shown) through its chain drive 66 with another sprocket wheel and gear (not shown) of a forward chamber into which the carrier will be transferred. As indicated above, the drive pinions are spaced so that the advance pinion picks up the carrier rack before the rear (driving) pinion disengages. Accordingly, since it may be desirable to operate the drive pinions at different speeds, the carrier must make smooth transition from one drive to the other.

As regards desired acceleration of the carrier from a lock into a buffer chamber for example, the one-way running clutch 68 allows the carrier rack, which is now assumed to be primarily driven by a respective chamber pinion 30, to in effect, overrun the forward pinion 32 during the time required to accelerate the carrier into the chamber. Thus, the clutch allows the pinions to mesh with the rack simultaneously without being synchronized. In effect, the pinions are self-synchronizing with respect to each other and the carrier rack. By this means, the separately driven sprocket wheels can be operated at desired rates during the transfer processing.

Where a fixed speed relation between the pinions 30 and 32 for example, is preferred, a single motor and common drive with reduction gearing as required, can be used in lieu of two or more motors.

According to general practice, shields 98 and 100 are mounted over the bearing housing and roller supports, respectively, to protect the gear drives, support and guide rollers, and other moving parts from vapor deposits. The carrier is also provided with adjustable means 102 at the side opposite the rack for magnetically operating as required a proximity or limit switch 104 that is mounted on the chamber side wall 44 for controlling exterior motor circuits. The function of the proximity switches is to sense when a carrier reaches each key position and when it is clear of lock valves. As such specific motor control involves conventional practice and does not concern the present invention, the related circuits, etc. need not be shown.

The carrier frame at the side wall 44 is also provided with stabilizing rollers 106 that engage the upper side of the frame opposite the support rollers 22 for maintaining together with the pinions at the rack side, linear horizontal movement of the entire carrier frame. The rollers 106 are suitably mounted on brackets or the like 108, that in turn are mounted on the chamber side wall guide rail 50. The side wall 44 also has a passage 110, as indicated in FIGS. 2 and 3, for connection to an exterior vacuum pump. A conventional viewport 112 is mounted in the process chamber side wall 42.

Since the compartments are preferably of the modular type, means are provided for ensuring proper alignment of the transfer means as the substrate carriers move through the various in-line chambers. To this end, the guide rails 48 and 50 that carry the platform support and guide rollers, can be adjusted both horizontally and vertically as required, for corresponding alignment with the guide rails of adjacent chambers. Vertical adjustment of the rail 50 for example, referring to FIG. 2, is achieved by mounting the rail laterally on eccentric bushings 114 so that rotation of the bushing raises or lowers the rail. Each bushing is rotatable on a bolt 113 that is fixed to the corresponding side wall. It can be secured by lock nuts or the like 115 in the adjusted angular position. Horizontal (lateral) adjustment can be achieved simply by shims suitably positioned on the lateral mounting bolts 113 as indicated at 116. Each rail as shown in FIG. 2, is mounted at two points, i.e. on two bushings, and the rail at one mounting has a slot 118 that provides for linear thermal expansion and contraction of the rail.

In the horizontal mode apparatus described above, coating may be achieved in well known manner by electron beam evaporation, in which case the substrates may be stopped over the source, or by sputtering electrodes, in which case it is desirable to pass the substrates slowly past the source.

Thus, for evaporation only intermittent motion of the carrier is required such as transfer between the coating chamber and the entrance and exit locks respectively, thereby eliminating the need for buffer chambers. On the other hand, since sputtering requires both intermittent and uniform motions for the carrier (with need to accelerate the carrier into and out of coating processes to expedite production), buffer chambers are used in the sputtering process for the transfer transition. Each carrier with substrate tray is stopped in the load and unload locks during the required gating, etc. operations.

In operation, assuming for example that the substrates are to be coated by a sputtering process, and that the in-line apparatus includes a buffer chamber with a lock (load and unload) at each end of the coating zone, the substrate carrier according to the invention can be intermittently or continuously accelerated or moved at uniform rates as desired for expediting production. In particular, the carrier can be accelerated into or out of position in the respective load, buffer and unload chambers as contrasted with its uniform movement within the coating zone. Once the carrier has entered a coating zone the appropriate proximity switch or equivalent, causes the drive motor and pinions to move the carrier continuously and comparatively slowly at a uniform rate through the zone. As the carrier is leaving a coating zone to enter the last buffer chamber, it again operates an appropriate proximity switch to cause acceleration of the carrier out of the buffer chamber into the unload lock where it may be stopped. Prior to this, the following carrier which was accelerated into the first buffer chamber, has emerged therefrom and is now moving uniformly and continuously in the coating zone a short distance behind the first carrier.

Figure 6:
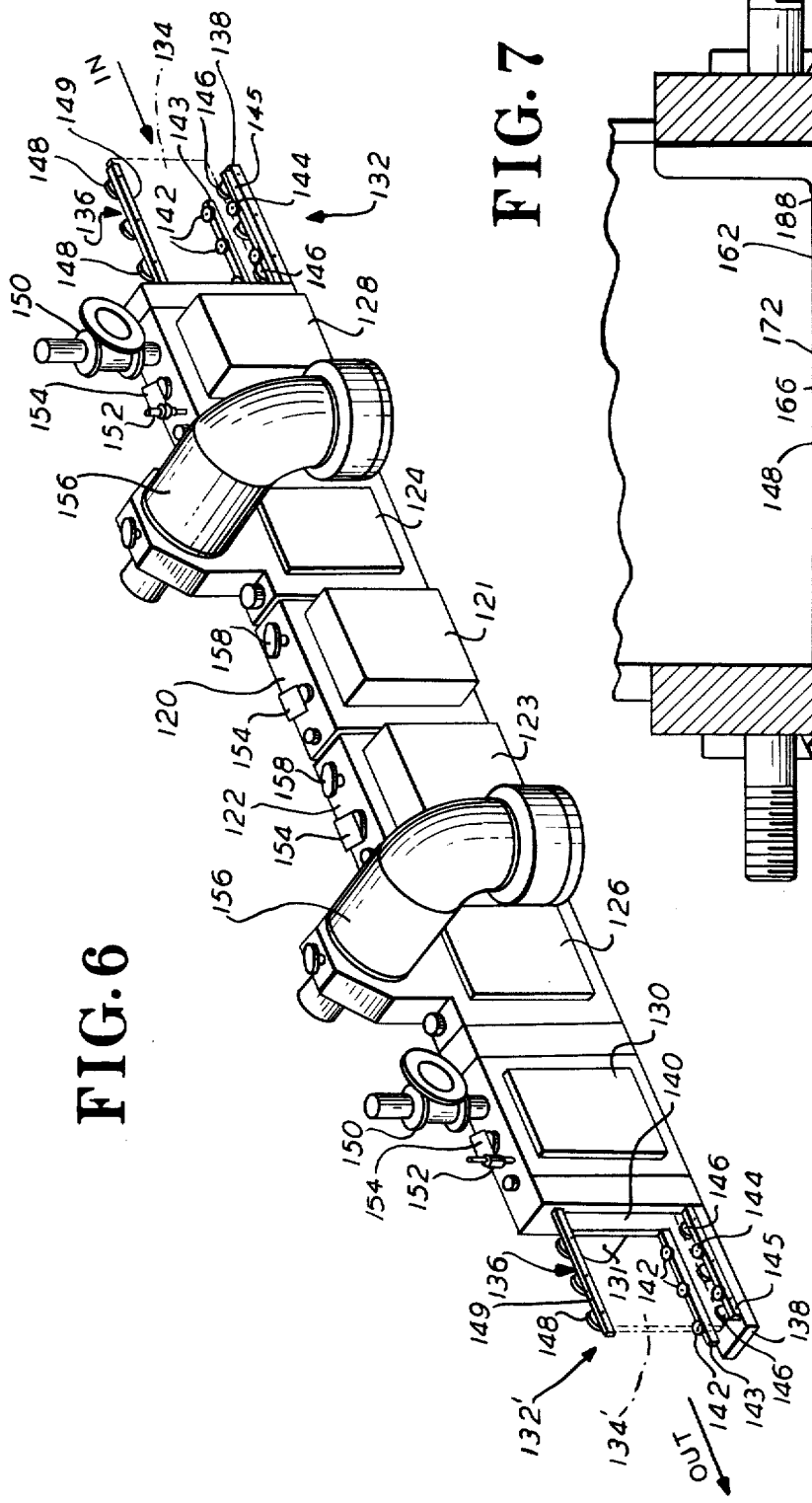
FIG. 6 is a side view in perspective illustrating an in-line multiple chamber vacuum coating system embodying the invention, wherein translation of the substrate carrier is in the vertical mode.

Since the rate of carrier traversal of the coating chamber determines the productive capacity of the apparatus, it is also important that the spacing of the carriers be reduced to a practical minimum. To this end, a conventional tooth-counter of the photo-optical type, for example, (not shown) can be transversely located with respect to the external drive chain sprocket wheel for controlling in known manner the transition point where the carrier moves from accelerated to uniform motion, and vice versa, so as to follow in fixed relation the preceding carrier as it moves through the processing chamber. A gate lock also could be operated in known manner by the counter, once the carrier entered a tooth-counting zone.

Where the coating process is to be done in the vertical mode, i.e. with the substrate carriers positioned on edge in a vertical plane that is transverse to one or more laterally disposed deposition sources, the in-line coating system can take the form illustrated in FIG. 6. In this example, two central coating chambers 120 and 122 are shown for concurrent coating of substrates on two or more carriers. Buffer chambers 124 and 126 are at opposite sides respectively, of the coating zone. The buffer chamber 124 is connected through a gate or slit valve to a load-lock chamber 128, and the buffer chamber 126 is similarly connected to an unload-lock chamber 130. The load-lock chamber has a carrier entrance slot and gate valve (such as shown in FIG. 1), and a loading or receiving platform or dock at 132 that functions to position the substrate carrier 134 (indicated in dotted lines) for loading in a generally similar manner to that also of FIG. 1. As shown in FIG. 6, a similar dock is mounted on the exit end of the buffer chamber 130. Each dock comprises upper and lower carrier supporting arms 136 and 138 that extend horizontally from the corresponding end walls of the respective locks 128 and 130.

Figure 6A:
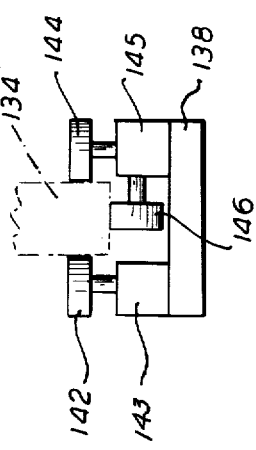
FIG. 6A is an end view of detail thereof.

As best shown at the exit end of the lock chamber 130, the carrier supporting arms 136 and 138 are located at opposite ends of the vertical carrier slot 140, the lower arm 138 being somewhat wider to accommodate the two rows of lateral guide rollers 142 and 144 (with vertical axes) at opposite sides respectively, of the carrier 134', together with the base supporting rollers 146 (with horizontal axes) on which the lower edge of the carrier platform rests. The rollers extend from guide rails 143, 145, FIG. 6A.

The upper arm 136 carries but a single line of rollers 148 (with horizontal axes) that engage a notch or groove at the upper part of the carrier frame structure as presently described (FIG. 7), for maintaining lateral stability of the carrier and for positively seating it on the lower support rollers.

The vertical mode in-line compartments are connected for conventional operation to vacuum exhaust lines, deposition sources, etc. In brief, each load and unload lock at 128 and 130 includes a coupling at 150 for connection to rough-vacuum lines, a proximity or carrier sensor signal outlet 152, and view port with angle-mirror 154.

Each buffer chamber 124 and 126 is connected to a high vacuum exhaust line 156 and is in direct slot-communication with the adjacent coating chamber 120 and 122, respectively. The buffer chambers connect with the lock chambers through gate or slit valves mentioned above. The coating chambers 120 and 122 have lateral housing extensions 121 and 123 respectively, for the installation of deposition sources; the chambers also include line couplings indicated at 158 for processing gas, and view ports 154. At the opposite sides of the chambers, carrier drive means (partly indicated at 131 on chamber 130) are laterally mounted as in FIGS. 2 and 3.

Figure 7:
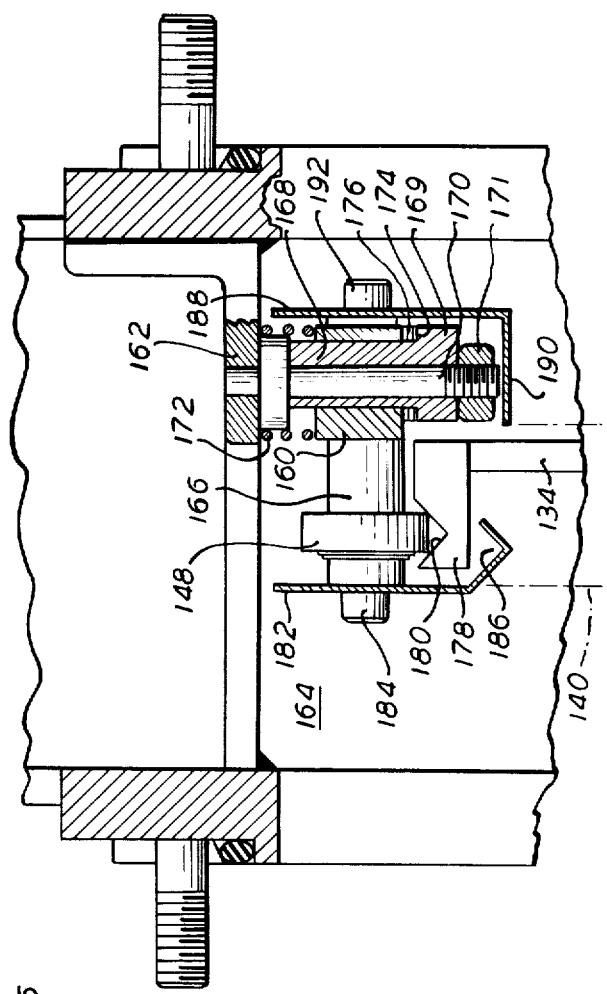
FIG. 7 is an end view of the upper part of a substrate carrier platform and related guide mounting for vertical mode translation.

A simplified and efficient roller bearing arrangement for laterally guiding and stabilizing the upper edge of the carrier frame in the vertical mode is shown by FIG. 7. As in the horizontal mode, the guide support rollers extend in spaced alignment throughout the in-line chambers substantially as described above. That is, the rollers can be mounted on chamber guide rails that in turn can be adjusted for alignment, generally as described above for FIGS. 2 and 3. In FIG. 6, the two lower carrier guide rails 143 and 145 on the dock arm 138, and the single upper guide rail 149 are aligned with corresponding counterparts within the respective chambers.

Returning to FIG. 7, a chamber guide rail 160 and its mounting structure are shown for supporting the upper ball-bearing rollers 148. The guide rail 160 is resiliently mounted on a flange-like extension 162 forming part of the upper wall of the lock or process chamber 164. As in the horizontal mode, the guide rail is positioned for lateral adjustment on eccentric rotatable bushings 168, each having an enlarged diameter end portion 169 with shoulder 174. The assembly is held in position by a through-bolt 170 secured to the extension 162 and constituting the central axis of the rotatable bushing. The bushing can also be locked in the adjusted angular position by a locking nut 171. A helical spring 172 seated between the wall extension 162 and the guide rail resiliently biases the rail against the bushing shoulder 174. Shims 176 between the bushing shoulder and rail provide for vertical adjustment of the guide rail.

Thus it is seen that the basic adjustment of the guide rail 160 in the vertical mode is similar to that of the guide rails 48 and 50 for the horizontal mode, FIG. 2, except that in FIG. 7 the eccentric bushing 168 provides for lateral or horizontal adjustment and the shims 176 provide for vertical adjustment. A thermal expansion slot (not shown) for the guide rail can be provided as shown at 118, FIG. 2.

The rollers 148 that stabilize and guide the upper edge of the carrier are mounted as indicated above on stub shafts, each being individually mounted in the guide rail 160. For providing an operative connection with the guide rollers, the carrier 134 has integral therewith a longitudinal strip 178 that extends along the upper edge of the carrier frame in overhanging relation, as shown. The overhanging portion has formed therein at its upper side a groove or V-notch 180 that extends throughout the length of the strip parallel to the carrier edge. This notch forms a seat for the stabilizing roller 148. Since the roller is carried by the guide rail 160, which in turn is resiliently mounted for downward bias at two (or more) supports, each roller 148 is urged into firm seating engagement at the converging sides of the notch. In this manner, the rollers 148 serve to restrain lateral movement of the strip and carrier in either direction, while concurrently holding the carrier firmly against the bottom support rollers for ensuring smooth and even linear movement of the carrier.

The lower edge of the platform may be supported and guided within the chambers by rollers in the manner shown by FIGS. 3 and 6, wherein a rack on one side of the platform is engaged by a pair of drive pinions. The prime motive means for the pinions (not shown) are suitably mounted beneath the chambers, generally in the manner indicated by FIGS. 2 and 3.

Thus, the independent pinion drive described above provides for transfer of a substrate carrier in the vertical mode through the respective chamber slot openings, either intermittently or uniformly at any desired speed, and independently of other carriers being concurrently processed.

An important consideration in practicing the vertical mode is ensuring against contamination of the substrates during coating by small particles of debris falling from the overhead carrier guiding and stabilizing rollers, etc. In this mode, sputtering targets are advantageously placed in the coating zone at opposite sides respectively of the carrier so that both sides of the transported substrates can be coated simultaneously. For example, in FIG. 6 sputtering sources can also be disposed in housing extensions (not shown) at the opposite sides of the coating chambers, corresponding to the extensions 121 and 123.

For precluding substrate contamination under all operating conditions, a longitudinally extending shield 182 is mounted on extensions 184 of respective roller shafts as indicated, so as to cover, in effect, the moving and related parts along the entire length of the in-line coating apparatus. For collecting any fall-out debris, the shield at its lower edge is bent inwardly underneath the strip 178 in generally positive curvature to form a channel-like receptacle or pocket 186. Thus, debris that otherwise might contaminate the left side (as viewed) of a substrate during processing, is intercepted and collected by the longitudinal pocket 186.

The opposite sides of the substrates are likewise protected by a longitudinal shield 188 having a lateral shelf-like inward extension 190 that can collect any debris from relatively moveable parts of the guide rail mounting, etc. The shield 188 is conveniently mounted with respect to the guide rail 160 on shaft extensions 192 of the respective guide rollers 148. Both shields also function in the usual manner to prevent accumulation of deposits on moving parts, bearing surfaces, etc.

In brief, it will be apparent that the present invention provides a comparatively simple, flexible and economical substrate transfer system for multiple-chamber vacuum processing apparatus that is readily adaptable to modular unit construction, and to operation of the substrate carriers in either the horizontal or vertical mode, as desired; furthermore, by reason of provision in the transfer system for independent drive acceleration of a substrate carrier into a forward uniform-speed drive for example, time savings and production efficiency of the vacuum processing operation are enhanced.

Having set forth the invention in what is considered to be the best embodiment thereof, it will be understood that changes may be made in the system and apparatus as above set forth without departing from the spirit of the invention or exceeding the scope thereof as defined in the following claims.

I claim:

1. In vacuum processing apparatus of the in-line multiple chamber type including a process chamber located between a load-lock chamber and an unload-lock chamber, a transfer means for moving substrates between and through the chambers comprising:
    a. a carrier for holding substrates:
    b. a plurality of rollers for supporting and laterally guiding a longitudinal edge of the carrier as it moves along a linear path through the chambers:
    c. a plurality of variable speed rotary gears spaced along the linear path of the carrier for driving the carrier between and through the chambers;
    d. a gear-rack integral with the carrier and extending along a longitudinal edge thereof for sequentially engaging the rotary driving gears, said gear-rack adapted for concurrent engagement by at least two driving gears; and
    e. motive means for operating the rotary driving gears to allow selective acceleration of the carrier.

2. A substrate transfer means as specified in claim 1 further comprising
    f. clutch means of the overrunning type associated with each driving gear for allowing smooth engagement between the gear-rack and successive driving gears.

3. Substrate transfer means as specified in claim 2 wherein each driving gear is a pinion having a floating axis, and the axis is spring-biased to cause precise positive engagement of the pinion with the carrier rack.

4. Substrate transfer means as specified in claim 2 wherein the rollers re mounted on longitudinal guide rails that in turn are adjustably mounted on a chamber wall for precise support and lateral guidance of the carrier.

5. A substrate transfer means as specified in claim 2 wherein the substrate carrier is supported in a horizontal plane for movement along a linear path over two sets of support rollers, one set beneath each of the two longitudinal opposite side edges of the carrier, and is laterally guided by two groups of guide rollers having axes oriented 90° from the support roller axes, one group spaced laterally from each of the two longitudinal opposite side edges of the carrier.

6. In vacuum processing apparatus of the multiple chamber type including a process chamber, a transfer means for moving substrates between at least two chambers comprising:
    a. a carrier for holding substrates;
    b. means including rollers mounted in the respective chambers for supporting the carrier as it moves through the chambers and additional rollers for laterally guiding the opposite side edges of the carrier in linear movement;
    c. aligned carrier guide rails horizontally mounted on the chamber walls, each rail holding both supporting and guide rollers and being transversely adjustable both vertically and laterally;
    d. an eccentric bushing for mounting the guide rails and providing one of the transverse adjustments;
    e. variable speed rotary gears spaced along the motion of the carrier for driving the carrier;

f. a gear-rack integral with the carrier and extending along a longitudinal edge thereof for sequentially engaging the rotary driving gears; and g. motive means for operating the rotary driving gears.

7. In vacuum processing apparatus of the multiple chamber type including a process chamber, a transfer means for moving substrates between at least two chambers comprising:

a. a carrier for holding substrates;

b. roller means for supporting and laterally guiding the carrier as it moves through the chambers;

c. variable speed rotary pinion gears spaced along the path of the carrier for driving the carrier, each pinion gear mounted for floating movement about a pivot;

d. a gear-rack integral with the carrier and extending along a longitudinal edge thereof for sequential engagement by the pinion gears;

e. spring bias means acting about each pivot for meshing the pinion gears with the rack;

f. a drive gear for engaging the pinion gear, the drive gear being coaxial with the pivot of the pinion gear; and g. motive means for rotating the drive gear and thereby operating the pinion gears.

8. Substrate transfer means as specified in claim 7 wherein the pinion gear is carried by a lever having its pivot coaxial with the drive gear, and a biasing spring bears on the lever at one side of the pivot to urge the pinion gear into mesh with the rack, and an adjustable element bears on the lever at the opposite side of the pivot to establish gear meshing tolerance.

9. In vacuum processing apparatus of the multiple chamber type including a process chamber, a transfer means for moving substrates between at least two chambers comprising:

a. a carrier having a longitudinal groove in an upper edge portion thereof for holding substrates;

b. a plurality of support rollers at the lower edge of the carrier for supporting the carrier in a vertical plane for longitudinal movement through the chambers;

c. a plurality of guide rollers having axes oriented 90° from the support roller axed for laterally engaging and guiding the carrier for linear movement;

d. spaced rollers for seating in the longitudinal groove to restrain the carrier from lateral movement;

e. variable speed rotary gears spaced along the path of the carrier for driving the carrier;

f. a gear-rack integral with the carrier and extending along a longitudinal edge thereof for sequentially engaging the driving gears; and g. motive means for operating the driving gears.

10. Substrate transfer means as specified in claim 9 wherein the longitudinal groove is a V-notch, and the spaced rollers are biased into seating engagement with the converging sides of the notch.

11. Substrate transfer means as specified in claim 9 wherein the spaced rollers are mounted on a longitudinal guide rail that in turn is mounted on a chamber wall, and the guide rail is spring biased to seat the rollers in the groove.

* * * * *